United States Patent

Lin

[11] Patent Number: 5,877,635
[45] Date of Patent: Mar. 2, 1999

[54] FULL-SWING BUFFER CIRCUIT WITH CHARGE PUMP

[75] Inventor: Perng-Fei Lin, Tou Liu, Taiwan

[73] Assignee: Taiwan Semiconductor Manufacturing Co., Ltd., Hsinchu, Taiwan

[21] Appl. No.: 812,430

[22] Filed: Mar. 7, 1997

[51] Int. Cl.[6] .............................................. H03K 19/0185
[52] U.S. Cl. ................................................ 326/83; 326/88
[58] Field of Search ................................ 326/83, 88, 121, 326/95, 98, 27

[56] References Cited

U.S. PATENT DOCUMENTS

| | | |
|---|---|---|
| 5,241,502 | 8/1993 | Lee et al. . |
| 5,281,869 | 1/1994 | Lundberg . |
| 5,301,097 | 4/1994 | McDaniel . |
| 5,369,317 | 11/1994 | Casper et al. . |
| 5,483,179 | 1/1996 | Dhong et al. . |
| 5,546,020 | 8/1996 | Lee et al. . |
| 5,559,452 | 9/1996 | Saito ......................................... 326/88 |

*Primary Examiner*—Michael Tokar
*Assistant Examiner*—Qui Van Duong
*Attorney, Agent, or Firm*—Christensen O'Connor Johnson & Kindness PLLC

[57] ABSTRACT

A buffer circuit for generating full-swing output is disclosed. The circuit includes a pull-up circuit for transferring a supply voltage to an output line in response to a first state of an input signal. A pull-down circuit is used to pull the output line down to a ground in response to a second state of the input signal. A control circuit is used to activate only one of the pull-up circuit and the pull-down circuit respectively in response to the first state and the second state of the input signal. Further, a charge-pump circuit responsive to the input signal and a clock signal is used to generate a charge-pump voltage to an input of the pull-up circuit so that the supply voltage is transferred to the output line.

18 Claims, 3 Drawing Sheets

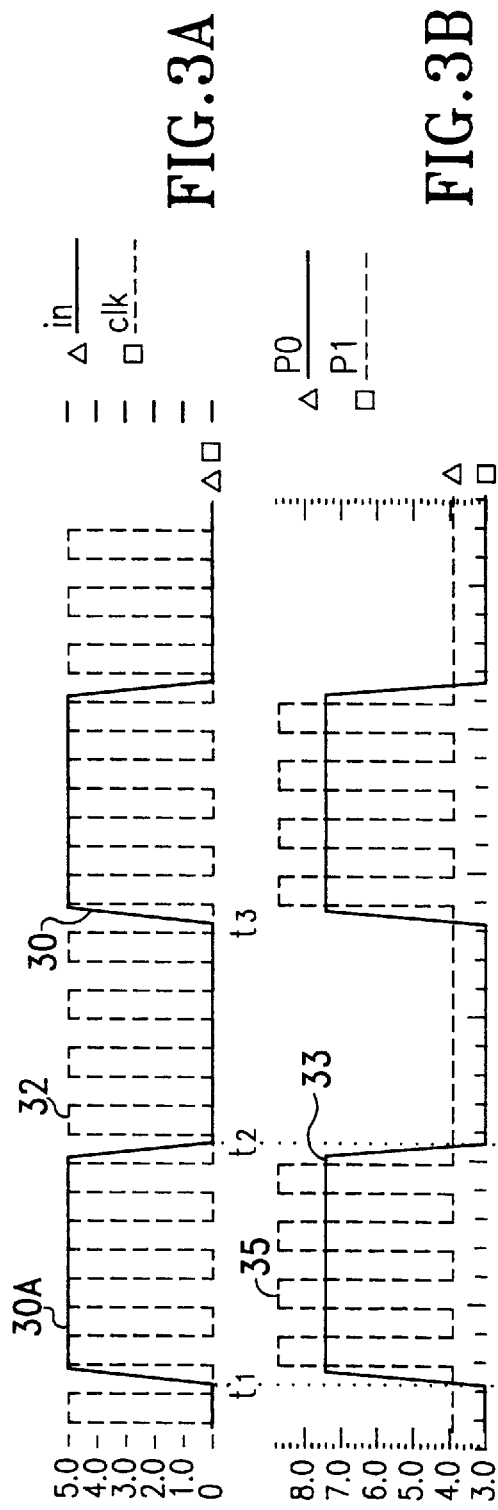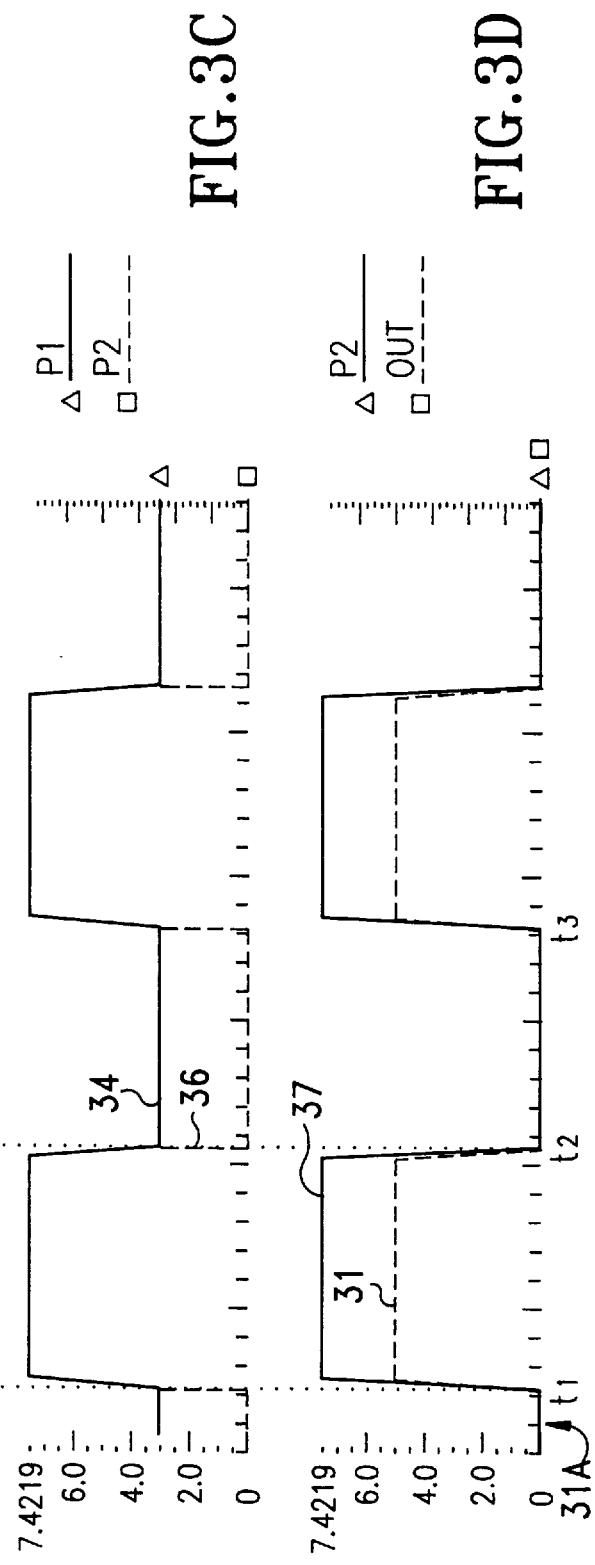

FULL-SWING BUFFER CIRCUIT WITH CHARGE PUMP

BACKGROUND OF THE INVENTION

1. Field of the Invention

The present invention relates to buffer circuits and, more particularly, to full-swing buffer circuits with a NMOS pull-up transistor. Still more particularly, the present invention relates to full-swing buffer circuits with a NMOS pull-up transistor and a charge pump.

2. Description of the Prior Art

An output buffer is conventionally adapted to buffer data processed by a semiconductor integrated circuit. More specifically, the output buffer receives a signal and generates an output signal with a sufficient voltage level to drive external peripheral circuits. A typical output buffer usually includes a pull-up driver for generating a logic high level output signal having a voltage level approximately equal to the supply voltage (e.g., Vdd), and a pull-down driver for generating a logic low level output signal having a voltage approximately equal to ground potential (i.e., $V_{ss}$). In order to achieve full-swing output, the pull-up driver usually uses a p-channel metal-oxide-semiconductor (PMOS) transistor as a pull-up device and a n-channel metal-oxide-semiconductor (NMOS) transistor as a pull-down device. More specifically, the PMOS pull-up device is connected to have its source coupled to receive the supply voltage and its drain connected to the output lead of the output buffer, whereas the NMOS pull-down device has its source connected to receive ground potential and its drain connected to the output lead of the output buffer. When the output buffer is to generate a logic high level output signal, the PMOS pull-up device is turned on and the NMOS pull-down device is turned off, thereby electrically connecting the output lead of the output buffer to the supply voltage source. Thus, the output buffer generates a logic high level output signal having a voltage approximately equal to the supply voltage. Conversely, when the output buffer is to generate a logic low level output signal, the NMOS pull-down device is turned on and the PMOS pull-up device is turned off. Consequently, the output buffer generates a logic low level output signal having a voltage approximately equal to ground potential.

However, a problem can arise when the output buffer is part of an integrated circuit having its substrate backbiased. The substrate of the integrated circuit is commonly biased at −1.5 volts in order to reduce the leakage current, for example, in a dynamic random access memory (DRAM). As a result of this backbiasing of the substrate, the PMOS pull-up transistor is susceptible to the well-known latch-up phenomenon.

One solution to this problem is to use a NMOS pull-up transistor instead of a PMOS pull-up transistor. A control signal received at the gate of the NMOS pull-up transistor causes the NMOS transistor to turn on or off. This control signal causes the NMOS transistor to turn on and pull-up the voltage at the output buffer's output lead to generate a logic high level output signal. In this conventional buffer, this control signal has a maximum voltage limited to the supply voltage, which only allows the NMOS device to pull-up the voltage at the output buffer's output lead to approximately the supply voltage minus the threshold voltage of the NMOS device (e.g., Vdd−Vt). More specifically, increasing the output signal voltage beyond the supply voltage minus the threshold voltage causes the gate-to-source voltage of the NMOS device to be less than the threshold voltage, thereby turning the NMOS device off. Thus, a conventional NMOS pull-up driver circuit does not achieve a full-swing output signal voltage. Accordingly, there is a need for a full-swing output buffer that is not susceptible to latch-up.

SUMMARY OF THE INVENTION

In accordance with the present invention, a buffer circuit is provided for generating full-swing output with reduced susceptibility to latch-up. In one embodiment, NMOS transistors are used for both the pull-up and pull-down devices. In response to the logic level of the input signal received by the buffer circuit, a control circuit provides control signals to turn on the NMOS pull-up transistor and turn off the NMOS pull-down transistor, and vice versa. The NMOS pull-up transistor has its source connected to the output lead of the buffer circuit and its drain connected to receive the supply voltage. In this embodiment, a charge pump circuit is connected to the gate of the NMOS pull-up transistor to increase the voltage at the gate of the NMOS pull-up transistor to approximately two times the supply voltage minus two threshold voltages of the NMOS pull-up transistor when the buffer circuit generates a logic high level output signal. When the gate of the NMOS pull-up transistor is charged to such a voltage, the gate-to-source voltage of the NMOS pull-up transistor will still exceed the threshold voltage when the voltage of the output signal is equal to the supply voltage. Thus, the NMOS pull-up transistor is capable of pulling up the voltage of the buffer circuit's output lead to the supply voltage. Thus, unlike conventional buffer circuits, the buffer circuit of the present invention achieves full-swing output without using a latch-up susceptible PMOS pull-up device.

In one embodiment, the charge pump circuit includes a first capacitor having one lead connected to receive the input signal and the other lead connected to the output lead of the charge pump circuit. In addition, two diode-connected transistors are connected in series between the supply voltage line and the output lead of the charge pump. The first diode, when forward biased, is connected to allow charge to flow from the supply voltage line to a node connected to the second diode. The second diode, when forward biased, is connected to allow charge to flow from the node to the output lead of the charge pump circuit. Thus, when the input signal is at a logic low level, the diodes cause the voltage at the output lead of the charge pump circuit to be approximately equal the supply voltage minus two threshold voltages. However, when at a logic high level, the input signal, through the first capacitor, causes the voltage at the output lead of the charge pump circuit to increase to approximately two times the supply voltage minus two threshold voltages. The control circuit provides this voltage to the gate of the NMOS pull-up transistor, thereby allowing the NMOS pull-up transistor to pull up the voltage of the buffer circuit's output lead to the supply voltage.

In a further refinement, the charge pump circuit includes a pass gate for passing a clock signal to one lead of a second capacitor in response to the logic level of the input signal. In one embodiment, the pass gate will pass the clock signal only when the input signal has a logic high level. The other lead of the second capacitor is connected to the node between the diodes. Therefore, when the input signal has a logic low level, the pass gate does not pass the clock signal to the second capacitor, which causes the clock signal to have no effect on the output voltage of the charge pump circuit. However, when the input signal has a logic high level, the pass gate passes the clock signal to the second capacitor, thereby increasing the voltage of the node between the diodes to a value of about two times the supply voltage minus one threshold voltage. Thus, charge will flow from the node, through the second diode, to the output lead of the charge pump circuit to replace any charge that leaked or redistributed from the first capacitor in charging the gate of the NMOS pull-up transistor. When the clock signal has a logic low level, the first diode prevents the voltage of the node from falling below the supply voltage minus one threshold voltage.

BRIEF DESCRIPTION OF THE DRAWINGS

FIGS. 3A to 3D illustrate timing diagrams of critical signals in the buffer circuit shown in FIG. 2.

DESCRIPTION OF THE PREFERRED EMBODIMENT

Figure 1:
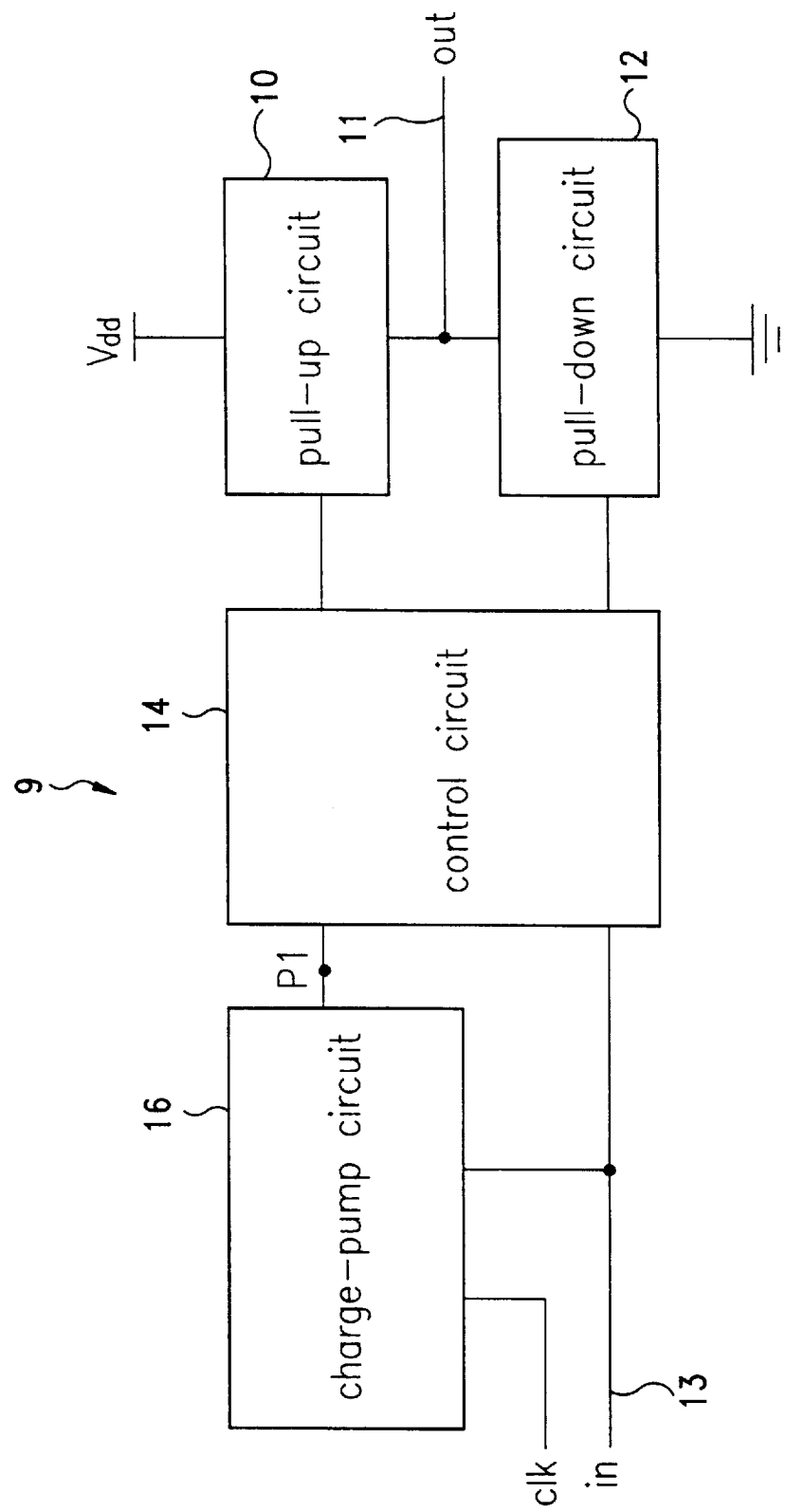
FIG. 1 shows a block diagram of an output buffer with charge-pump circuit in accordance with an embodiment of the present invention.

Referring to FIG. 1, there is shown a block diagram of an output buffer 9 with charge pump circuit in accordance with an embodiment of the present invention. As shown in this diagram, the output buffer 9 includes a pull-up circuit 10 connected between an output line 11 and a $V_{dd}$ supply voltage line. The pull-up circuit 10 has a NMOS pull-up transistor (not shown) instead of a PMOS pull-up transistor as is used in many conventional output buffers. The output buffer 9 also includes a pull-down circuit 12 connected between the output line 11 and a ground voltage line (e.g., a $V_{ss}$ line). In this embodiment, the pull-down circuit 12 uses a NMOS pull-down transistor.

The output buffer 9 also includes a control circuit 14 connected to the pull-up circuit 10 and the pull-down circuit 12. The control circuit 14 is also connected to receive an input signal IN via an input line 13. In response to the input signal IN, the control circuit 14 causes only one of either the pull-up circuit 10 or the pull-down circuit 12 to be enabled at the same time. For example, when the pull-up circuit 10 is enabled, the pull-down circuit 12 is disabled, and vice versa. In this embodiment, the voltage on the output line 11 (i.e., the output signal OUT) is pulled down to a voltage substantially equal to the ground voltage through the pull-down circuit 12 when the input signal IN is at a logic low level. The term "substantially equal" is used in this context to mean equal in voltage but for any minor deviations caused by noise, leakage, IR drop or charge redistribution. Conversely, the pull-up circuit 10 pulls up the voltage on the output line 11 to be substantially equal to the supply voltage $V_{dd}$ when the input signal IN is at a logic high level.

The output buffer 9 also includes a charge pump circuit 16 connected to receive a clock signal clk and the input signal IN. The charge pump circuit 16 is also connected to the control circuit 14 through a node p1. The charge pump circuit 16 operates as follows. When the input signal IN is inactive (i.e., having a logic low level in this embodiment), the charge pump causes the voltage at the node p1 to be at a voltage less than the supply voltage. However, when the input signal IN becomes active (i.e., having a logic high level in this embodiment), the charge pump circuit 16 causes the output voltage at the node p1 to increase to a voltage greater than or equal to the supply voltage plus the threshold voltage of the aforementioned NMOS pull-up transistor. In this embodiment, when the input signal IN is active, the control circuit 14 couples the node p1 to the gate of the NMOS pull-up transistor of the pull-up circuit 10. Because its gate-to-source voltage exceeds the supply voltage by at least a threshold voltage, the NMOS pull-up transistor can pull up the voltage of the output line 11 to the supply voltage. Thus, unlike the conventional output buffers using NMOS pull-up transistors, the output buffer 9 achieves full-swing operation.

Figure 2:
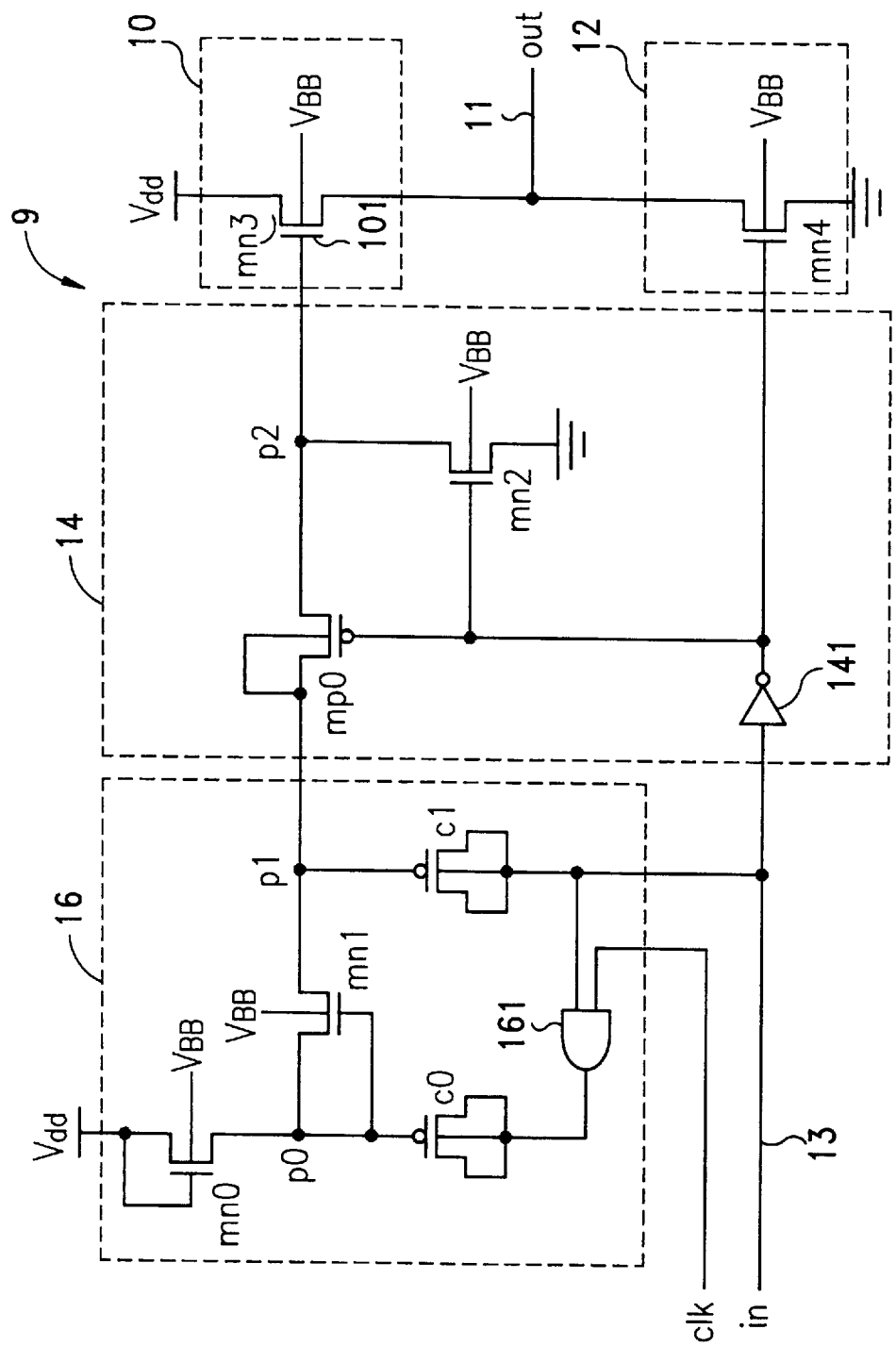
FIG. 2 shows a circuit diagram illustrating an output buffer in connection with the block diagram shown in FIG. 1 in accordance with the embodiment of the present invention.

FIG. 2 shows a circuit diagram schematically illustrating one embodiment of an output buffer implementing the block diagram shown in FIG. 1. Timing diagrams of pertinent signals are shown in FIGS. 3A to 3D. In this embodiment, the pull-up circuit 10 is implemented with a NMOS transistor mn3 having its source connected the output line 11 and its drain connected to the $V_{dd}$ supply voltage line. The NMOS transistor mn3 also has its substrate connected to receive the backbias voltage $V_{BB}$. The gate 101 of the NMOS transistor mn3 is connected to the control circuit 14.

The pull-down circuit 12 is implemented in this embodiment with another NMOS transistor mn4. The NMOS transistor mn4 has its drain connected to the output line 11 and its source connected to the ground voltage line. The substrate of the NMOS transistor mn4 is also connected to receive the backbias voltage $V_{BB}$.

The control circuit 14 is implemented with an inverter 141, a PMOS transistor mp0 and a NMOS transistor mn2. The inverter 141 is connected to receive the input signal IN via the input line 13. The output lead of the inverter 141 is connected to the gates of the PMOS transistor mp0 and the NMOS transistors mn4 and mn2. The PMOS transistor mp0 has its source connected to the node p1 and its drain connected to the gate 101 of the pull-up NMOS transistor mn3. The gate 101 of the pull-up transistor mn3 is also connected to the drain of the NMOS transistor mn2. The NMOS transistor mn2 has source connected to the ground line.

The charge pump circuit 16 is implemented with a two-input AND gate 161, two capacitors C0 and C1, and two diode-connected NMOS transistors mn0 and mn1. The capacitors C0 and C1 are implemented in this embodiment with PMOS transistors each having its source and drain connected together to serve as one capacitor electrode with its gate serving as the other capacitor electrode.

The diode-connected NMOS transistor mn0 (i.e., having its drain connected to its gate) has its drain connected to the supply voltage $V_{dd}$ line and its source connected to a node p0. The node p0 is connected to one electrode of the capacitor C0 and to the drain of the diode-connected NMOS transistor mn1. The source of the diode-connected NMOS transistor mn1 is connected to the node p1 and one electrode of the capacitor C1. The other electrode of the capacitor C1 is connected to the input line 13. The input line 13 is also connected to one input lead of the two-input AND gate 161, which has its other input lead connected to receive the clock signal clk. The output lead of the AND gate 161 is connected to the other electrode of the capacitor C0.

Referring now to FIGS. 2 through 3D, the output buffer 9 operates as follows. Before time $t_1$, the input signal IN, represented by the waveform 30 in FIG. 3A, has a logic low level. For illustrative purposes, the input signal IN is a square wave with a period equal to about $(t_3-t_1)$. Thus, the inverter 141 provides a logic high level signal to the gates of the transistors mp0, mn2 and mn4. Consequently, the PMOS transistor mp0 is turned off, thereby isolating the gate of the pull-up transistor mn3 from the node p1. In addition, this logic high level signal causes the NMOS transistors mn2 and mn4 to turn on. The NMOS transistor mn2 therefore turns off the pull-up transistor mn3 by discharging its gate 101. At substantially the same time, the pull-down NMOS transistor mn4 discharges the output line 11. Thus, in response to a logic low level input signal IN, the control circuit 14 disables the pull-up circuit 10 and enables the pull-down circuit 12, resulting in the output signal OUT having a logic low level as shown by the portion 31A of the waveform 31 in FIG. 3D.

Also during this time period, the NMOS transistor mn0 functions as a diode, resulting in a voltage value of $V_{dd}-V_t$, at the node p0. The NMOS transistor mn1 also functions as a diode, making the voltage at the node p1 to have a value substantially equal to $V_{dd}-2V_t$. The term $V_1$ is used herein to denote the threshold voltage of the NMOS transistors in the output buffer, which is about 0.8 volts in this embodiment. It will be appreciated by those skilled in the art that the voltage at the nodes p0 or p1 is not affected by the clock signal clk (represented by the waveform 32 in FIG. 3A) and the input signal IN because the capacitors C0 and C1 receive constant logic low level signals from the AND gate 161 and the input signal line 13, respectively, during this time period.

During the period between time $t_1$ and $t_2$ (FIG. 3A), the input signal IN transitions to a logic high level as indicated by the portion 30A of the waveform 30, so that the inverter 141 outputs a logic low level signal, thus turning off both the pull-down NMOS transistor mn4 and the NMOS transistor mn2. Consequently, the NMOS transistors mn4 and mn2 no longer discharge the output line 11 and the gate 101 of the pull-up NMOS transistor mn3, respectively. In addition, the logic low level from the inverter 141 also turns on the PMOS transistor mp0, thereby electrically connecting the node p1 to the gate 101 of the pull-up NMOS transistor mn3. The capacitor C1 also receives the input signal IN, having a voltage approximately equal to the supply voltage $V_{dd}$, which increases the voltage at the node p1 from a value of about $(V_{dd}-2V_t)$ to a value of about $(2V_{dd}-2V_t)$, as indicated by the waveforms 33 and 34 in FIGS. 3B and 3C, respectively. Moreover, the AND gate 161 functions to pass the clock signal clk to the capacitor C0, which further periodically pumps the voltage at the node p0 from a value of about $(V_{dd}-V_t)$ to a value of about $(2V_{dd-Vt})$, as indicated by the waveform 35 in FIG. 3B.

Because the PMOS transistor mp0 is turned on as described above for the time period between time $t_1$ and $t_2$, the charge stored in capacitor C1 is shared with the gate 101 of the pull-up NMOS transistor mn3, causing the voltage at the nodes p1 and p2 to be substantially equal, as shown in FIG. 3C. The waveforms 36 and 37 in FIGS. 3C and 3D represent the voltage at the node p2 (and the gate 101), respectively. In this embodiment, the capacitor C0 and the capacitor C1 are realized in a conventional manner using PMOS transistors, each having a capacitance of about 1.8× $10^{-12}$ farad. Further, as the capacitance of the capacitor C1 is larger than the capacitance of the gate 101 (about 0.15× $10^{-12}$ farad in this embodiment), the redistribution of charge from the capacitor C1 would normally cause the voltage at the node p2 and the gate 101 to be slightly lower than $2V_{dd}-2V_t$. However, charge stored in the capacitor C0 is pumped by the clock signal clk and is redistributed to the nodes p0 and p1, thus maintaining the voltage at the gate 101 of the NMOS pull-up transistor mn3 at a value substantially equal to $(2V_{dd}-2V_t)$. Because the value of the aforementioned charge-pump voltage $(2V_{dd}-2V_t)$ at the gate 101 is larger than $(V_{dd}+V_t)$ for typical values of $V_{dd}$ (e.g., 5v in this example), the circuit of FIG. 2 results in a full-swing output buffer that generates a logic high level output voltage substantially equal to the supply voltage $V_{dd}$ and a logic low level output voltage substantially equal to the ground voltage. Moreover, because no PMOS pull-up transistor is used in the pull-up circuit 10, the latch-up problem caused by the backbiasing of the substrate is avoided.

Although specific embodiments, including the preferred embodiment, have been illustrated and described, it will be appreciated by those skilled in the art of output buffer circuits that, in light of the present disclosure, various modifications may be made without departing from the spirit and scope of the present invention, which is intended to be limited solely by the appended claims. For example, the realization of the capacitors C0, C1, the pass gate 161, and the control circuit 14 are not limited to that of the embodiment described. Further, additional circuitry may be added to ensure "break-before-make" operation to reduce power dissipation during transitions of the output signal OUT.

What is claimed is:

1. A buffer circuit comprising:

an input line coupled to receive an input signal;

a clock line coupled to received a clock signal;

an output line;

pull-up means for pulling up a voltage at the output line to a supply voltage in response to the input signal being in a first state;

pull-down means for pulling down the voltage at the output line to a ground voltage in response to the input signal being in a second state:

control means for disabling said pull-up means in response to the input signal being in the second state and for disabling said pull-down means in response to the input signal being in the first state; and charge-pump means responsive to the input signal being in the first state and the clock signal for providing a charge pump voltage to an input lead of said pull-up means, said voltage being greater than the supply voltage, wherein said charge-pump means comprises:

a pass gate coupled to receive the clock signal and the input signal, said pass gate outputting said clock signal when the input signal is in the first state;

a first capacitor having a first electrode coupled to receive the input signal and a second electrode coupled to said output lead of said charge-pump means;

a first diode having an input lead and an output lead, said input lead of said first diode connected to receive the supply voltage;

a second capacitor having a first electrode coupled to an output lead of said pass gate and a second electrode coupled to said output lead of said first diode; and a second diode having an input lead and an output lead, said input lead of said second diode connected to said output lead of said first diode, said output lead of said second diode connected to said control means.

2. The circuit according to claim 1, wherein said pull-up means comprises an NMOS pull-up transistor, a drain of the NMOS pull-up transistor being connected to receive the supply voltage, and a source of the NMOS pull-up transistor being connected to the output line.

3. The circuit according to claim 2, wherein said pull-down means comprises an NMOS pull-down transistor, a drain of the NMOS pull-down transistor being connected to the output line, and a source of the NMOS pull-down transistor being connected to receive the ground voltage.

4. The circuit according to claim 2, wherein said control means is configured to provide a conductive path between an output lead of said charge-pump means and a gate of said NMOS pull-up transistor when the input signal is in the first state, said conductive path providing said charge-pump voltage to said gate of the NMOS pull-up transistor.

5. The circuit according to claim 1, wherein said first and second diodes each comprises an NMOS transistor having a threshold voltage.

6. The circuit according to claim 5, wherein when the input signal is in the second state, said charge-pump voltage is equivalent to the supply voltage minus the sum of the threshold voltage of the NMOS transistor of the first diode and the threshold voltage of the NMOS transistor of the second diode.

7. The circuit according to claim 5, wherein when the input signal is in the first state, said charge-pump voltage is equivalent to two times the supply voltage minus the sum of the threshold voltage of the NMOS transistor of the first diode and the threshold voltage of the NMOS transistor of the second diode.

8. The circuit according to claim 1, wherein said control means provides said charge-pump voltage to an input lead of the pull-up means when the input signal is in the first state.

9. The circuit according to claim 8, wherein said control means isolates the charge-pump voltage from the input lead of said pull-up means when the input signal is in the second state.

10. A buffer circuit formed on and in a semiconductor substrate, said substrate being biased with a negative voltage relative to a ground voltage, the buffer circuit comprising:
   an input line coupled to receive an input signal;
   a clock line coupled to receive a clock signal;
   an output line;
   a NMOS pull-up transistor having a source connected to the output line and having a drain connected to a supply voltage line, said supply voltage line configured to provide a supply voltage, wherein said NMOS pull-up transistor is configured to cause said output line to have a voltage substantially equal to the supply voltage when the input signal is in a first state;
   a NMOS pull-down transistor having a drain connected to the output line and having a source connected to a ground line, said ground line configured to provide the ground voltage, wherein said NMOS pull-down transistor is configured to cause said output line to have a voltage substantially equal to the ground voltage when the input signal is in a second state;
   a switch circuit coupled to said input line, said NMOS pull-up transistor and said NMOS pull-down transistor, wherein said switch circuit is configured to provide a logic low voltage to a gate of the NMOS pull-down transistor in response to the first state of the input signal and to provide a logic low voltage to a gate of the NMOS pull-up transistor in response to the second state of the input signal; and
   a charge-pump circuit coupled to the input line, the clock line and the switch circuit, wherein the charge-pump circuit is configured to provide a first charge-pump voltage to an input lead of said switch circuit in response to the first state of the input signal, said switch circuit providing said first charge-pump voltage to said gate of said NMOS pull-up transistor.

11. The buffer circuit according to claim 10 wherein said charge-pump circuit comprises:
   a pass gate coupled to receive the clock signal and the input signal, wherein said pass gate is configured to pass the clock signal to an output lead of the pass gate during the first state of the input signal and to block the clock signal from the output lead of the pass gate during the second state of the input signal;
   a first diode-connected NMOS transistor having a drain connected to receive the supply voltage; and
   a second diode-connected NMOS transistor having a drain connected to a source of the first diode-connected NMOS transistor and having a source connected to the input lead of said switch circuit, wherein in response to the second state of the input signal said second diode provides a second charge-pump voltage to said input lead of said switch circuit, said first charge pump voltage being greater than said second charge pump voltage.

12. The buffer circuit according to claim 11 wherein said second charge-pump voltage is equivalent to the supply voltage minus a sum of a threshold voltage of the first diode-connected NMOS transistor and a threshold voltage of the second diode-connected NMOS transistor.

13. The buffer circuit according to claim 12 wherein said charge-pump circuit further comprises a first capacitor coupled between said input lead of said switch circuit and said input line, wherein said first state of said input signal shifts the voltage across said first capacitor, thereby causing the voltage at said input lead of said switch circuit to increase by a value substantially equal to the supply voltage, said first charge pump voltage being equivalent to the second charge-pump voltage plus the supply voltage.

14. The buffer circuit according to claim 13, wherein said charge-pump voltage further comprises:
   a logic gate having a first input lead coupled to the input line, a second input lead coupled to the clock line and an output lead, wherein said logic gate is configured to provide a periodic signal dependent on said clock signal at said output lead of said logic gate when the input signal is in the first state;
   a second capacitor coupled between said output lead of said logic gate and said source of said first diode-connected NMOS transistor, wherein said periodic signal from said logic gate causes the voltage at said source of said first diode-connected NMOS transistor to periodically shift by a value substantially equal to the supply voltage.

15. The buffer circuit according to claim 10, wherein said switch circuit electrically isolates said input lead of said switch circuit from said gate of said NMOS pull-up transistor during the second state of the input signal.

16. An integrated circuit buffer circuit comprising:
   an input line coupled to receive an input signal having a first state and a second state;
   a clock line coupled to receive a clock signal;
   an output line;
   a first switch circuit having a first input lead, a second input lead, a first output lead and a second output lead, said first input lead coupled to said input line, wherein said first switch circuit is configured to couple said first output lead to a ground line and to provide a logic high level voltage to said second output lead when said input signal is in said second state, said ground line configured to provide a ground voltage, said first switch circuit further being configured to couple said second input lead to said first output lead and to provide a logic low level voltage to said second output lead when said input signal in said first state;

a NMOS pull-up transistor having a drain coupled to a supply voltage line, having a source coupled to said output line and having a gate coupled to said first output lead of said first switch circuit, said supply voltage line configured to provide a supply voltage, said NMOS pull-up transistor having a threshold voltage;

a NMOS pull-down transistor having a drain coupled to said output line, having a source coupled to the ground line and having a gate coupled to said second output lead of said switch; and a charge pump circuit having an input terminal coupled to said input line, having a clock terminal coupled to said clock line and having an output terminal coupled to said second input lead of said first switch circuit, wherein said charge pump circuit is configured to provide a first charge pump voltage at said output terminal when said input signal is in said first state and to provide a second charge pump voltage at said output terminal when said input signal is in said second state, said first charge pump voltage being greater than said supply voltage by at least the threshold voltage of said NMOS pull-up transistor, and said second charge pump voltage being less than said first charge pump voltage, and wherein in response to said first charge pump voltage, said NMOS pull-up transistor causes said output line to have a voltage substantially equal to said supply voltage.

17. The buffer circuit according to claim 16 wherein said charge-pump circuit comprises:

a first diode-connected NMOS transistor having a drain connected to the supply voltage line, said first diode-connected NMOS transistor having a threshold voltage;

a second diode-connected NMOS transistor having a drain connected to a source of the first diode-connected NMOS transistor and having a source connected to the output terminal of the charge-pump circuit, said second diode-connected NMOS transistor having a threshold voltage, wherein in response to the second state of the input signal said second diode outputs said second charge pump voltage, said second charge pump voltage being substantially equal to the supply voltage minus a sum of the threshold voltage of the first diode-connected NMOS transistor and the threshold voltage of the second diode-connected NMOS transistor.

18. The buffer circuit of claim 17 wherein said charge-pump circuit further comprises:

a first capacitor having a first electrode coupled to said input terminal of said charge-pump circuit and having a second electrode coupled to said output terminal of said charge-pump circuit;

a second capacitor having a first electrode coupled to said drain of said second diode-connected NMOS transistor and having a second electrode; and a second switch circuit having a first node coupled to the clock terminal, having a second node coupled to the input terminal of the charge-pump circuit and having a third node coupled to the second electrode of said second capacitor, wherein said second switch circuit is configured to provide at said third node a periodic signal dependent on the clock signal when the input signal is in the first state and to provide a substantially constant voltage at said third node when said input signal is in the second state, wherein said input signal being in said first state causes said output terminal of said charge-pump circuit to increase to said first charge pump voltage and to periodically cause said drain of said second diode-connected NMOS transistor to have a voltage substantially equal to two times the supply voltage minus the threshold voltage of the first diode-connected NMOS transistor.

* * * * *